United States Patent [19]

Mashiko

[11] Patent Number: 4,896,197
[45] Date of Patent: Jan. 23, 1990

[54] SEMICONDUCTOR MEMORY DEVICE HAVING TRENCH AND STACKED POLYSILICON STORAGE CAPACITORS

[75] Inventor: Koichiro Mashiko, Hyogo, Japan

[73] Assignee: Mitsubishi Denki Kabushiki Kaisha, Tokyo, Japan

[21] Appl. No.: 132,645

[22] Filed: Dec. 8, 1987

[30] Foreign Application Priority Data

Dec. 10, 1986 [JP] Japan ................ 61-293733

[51] Int. Cl.$^4$ ............... H01L 29/78; H01L 29/06; H01L 27/02
[52] U.S. Cl. ............................ 357/23.6; 357/55; 357/41
[58] Field of Search ................ 357/23.6, 55, 41; 437/52

[56] References Cited

U.S. PATENT DOCUMENTS

| | | | |
|---|---|---|---|
| 4,419,743 | 12/1983 | Taguchi et al. | 357/23.7 |
| 4,460,911 | 7/1984 | Salters | 357/23.6 |
| 4,716,548 | 12/1987 | Mochizuki | 357/23.6 |

FOREIGN PATENT DOCUMENTS

| | | | |
|---|---|---|---|
| 60-253255 | 12/1985 | Japan . | |
| 60-258952 | 12/1985 | Japan | 357/23.6 |
| 61-177771 | 8/1986 | Japan . | |

OTHER PUBLICATIONS

IEDM 84: "Trench Capacitor Leakage in MBIT DRAMS", by M. Elahy et al., 9.6 1984, pp. 248-251.

Primary Examiner—Joseph E. Clawson, Jr.
Assistant Examiner—Robert P. Limonek
Attorney, Agent, or Firm—Lowe, Price, LeBlanc, Becker & Shur

[57] ABSTRACT

A first impurity region is formed on the inner surface of a trench formed on the major surface of a semiconductor substrate. The trench is filled with a vertical portion of a first electric conductor having a reversed L-shaped cross section through an insulating film. A first transistor having a first impurity region serving as a source/drain region is formed on the semiconductor substrate. A second impurity region serving as a source/drain region of a second transistor is formed on the major surface of the semiconductor substrate and spaced from the trench. A second electric conductor having a reversed L-shaped cross section for connecting the vertical portion to the second impurity region is formed, and a horizontal portion of the second electric conductor is formed to be stacked on a horizontal portion of the first electric conductor with an insulating film formed therebetween.

13 Claims, 6 Drawing Sheets

SEMICONDUCTOR MEMORY DEVICE HAVING TRENCH AND STACKED POLYSILICON STORAGE CAPACITORS

BACKGROUND OF THE INVENTION

1. Field of the Invention

The present invention is directed generally toward semiconductor memory cell arrays, and more particularly, toward high density storage capacitor structures in dynamic random access memory (DRAM) arrays.

2. Description of the Prior Art

Recently, a semiconductor memory device has been rapidly developed. In a random access memory (RAM), various trials have been made for achieving high integration without decreasing the storage characteristics.

FIG. 1 is a block diagram showing an example of a structure of a conventional RAM. Referring to FIG. 1, a plurality of word lines and a plurality of bit lines are arranged to intersect with each other in a memory cell array 1, a memory cell being provided at each of intersections of the word lines and the bit lines. The memory cell is selected based on an intersection of a single word line selected by an X address buffer decoder 2 and a single bit line selected by a Y address buffer decoder 3. Data is written into the selected memory cell or data stored in the memory cell is read out. Writing/reading of data is commanded by a read/write control signal (R/W) applied to a R/W control circuit 4. When data is written, input data (Din) is inputted to the selected memory cell through the R/W control circuit 4. On the other hand, when data is read out, the data stored in the selected memory cell is detected and then amplified by a sense amplifier 5, and outputted to the exterior as output data (Dout) through a data output buffer 6.

FIG. 2 is a diagram of an equivalent circuit of a dynamic type memory cell for explaining write/read operation of the memory cell. Referring to FIG. 2, the dynamic type memory cell comprises a single field effect transistor 8 and a capacitor 9. A gate electrode of the field effect transistor 8 is connected to a word line 10, and a source/drain electrode connected to the capacitor 9 is connected to a bit line 7. When data is written, the field effect transistor 8 is rendered conductive by application of a predetermined potential to the word line 10, so that electric charge applied to the bit line 7 is stored in the capacitor 9. On the other hand, when data is read out, charge stored in the capacitor 9 is extracted through the bit line 7 because the field effect transistor 8 is rendered conductive by application of a predetermined potential to the word line 10. Thus, since storage capacitance of the memory cell depends on capacitance of the capacitor 9, a trench memory cell in which a trench is formed on the semiconductor substrate and a charge storage region is formed on the inner surface of the trench so that storage capacitance can be maintained or increased, was developed for achieving high integration of the memory cell arrays.

FIG. 3 is a plan view of a dynamic RAM of a folded bit line type using the trench memory cell, and FIG. 4 is a cross sectional view taken along a line IV—IV shown in FIG. 3. The trench memory cell was proposed in, for example, Lecture Number 9.6 in International Electron Device Meeting, 1984 (IEDM '84).

Referring to FIGS. 3 and 4, a plurality of memory cells 12 are formed on the surface of a P type semiconductor substrate 11, the memory cells 12 being isolated by isolating oxide films 14. Each of the memory cells 12 comprises a charge storage region 16 for storing charge, a transfer gate region 18, and an n type impurity region 20 connected to a bit line 22. The charge storage region 16 comprises a trench 24 (a region enclosed by a solid line in FIG. 3) formed on the major surface of the semiconductor substrate 11, an n+impurity region 30 formed on a part of the major surface of the semiconductor substrate 11 including the inner surface of the trench 24, a capacitor insulating film 32 covering the inner surface of the trench 24, and a cell plate 28 formed of polysilicon (polycrystalline silicon) or the like with which the trench 24 is filled through the capacitor insulating film 32. The transfer gate region 18 comprises a channel region 34 between the impurity region 20 and the n+impurity region 30 and a word line 26 serving as a gate electrode over the channel region 34 and formed of polysilicon or the like. The impurity region 20, the transfer gate region 18 and the n+impurity region 30 constitute a switching transistor. Referring to FIG. 4, description is made on write/read operation of data in FIG. 2. At the time of writing data, when a predetermined potential is applied to the word line 26, an inversion layer is formed in the channel region 34, so that the impurity region 20 and the n+impurity region 30 are rendered conductive. Thus, charge applied to the bit line 22 is transferred to the charge storage region 16 through the channel region 34 and stored in the n+impurity region 30. On the other hand, at the time of reading out data, when a predetermined potential is applied to the word line 26, the charge stored in the n+impurity region 30 is extracted to the exterior through the inverted channel region 34, the impurity region 20 and the bit line 22.

Since the amount of thus stored charge depends on the size of the N+impurity region 30 facing the trench 24, that is, the area of the inner surface of the trench 24, formation of the trench 24 can contribute to formation of larger charge storage capacitance, as compared with the plane area occupied by the charge storage region 16. More specifically, if the trench 24 is formed and a trench capacitor utilizing the trench 24 is used, a charge storage capacitor having relatively large capacitance, as compared with the area occupied by a fine memory cell can be ensured. As a result, even a highly integrated dynamic RAM becomes a reliable memory device which is immune to soft errors caused by irradiation of alpha rays or the like and the other noise, since operating margin becomes sufficiently large through the capacitor having large capacitance.

However, the use of the trench capacitor has the above described advantage but presents a new problem to a dynamic RAM requiring high integration.

FIG. 5 is an enlarged cross sectional view of trenches of adjacent two memory cells shown in FIG. 4.

Generally, in a dynamic RAM, a P type semiconductor substrate 11 is set to a negative potential (about −3V) and a potential of about 5V or about 0V corresponding to memory information "1" or "0" is applied to n+impurity regions 30a and 30b serving as charge storage regions. Thus, a reverse-bias voltage is always applied between the n+impurity regions 30a and 30b and the semiconductor substrate 11, irrespective of the memory information. As a result, depletion regions 36a and 36b are formed around the n+impurity regions 30a and 30b. The higher the reverse-bias voltage is or the lower the impurity concentration of the semiconductor substrate is, the more easily the depletion regions 36a and 36b expand. Since the P type impurity concentration of the semiconductor substrate 11 becomes generally lower in the position spaced apart from the major surface, the depletion regions 36a and 36b expand as shown in FIG. 5. As a result, if trenches 24a and 24b are formed deep to increase storage capacitance, the distance between the adjacent depletion regions 36a and 36b (represented by a in FIG. 5) is further reduced. In addition, it is obvious that the distance is also reduced if trenches 28a and 28b are formed close to each other for high integration. Thus, if the adjacent trenches 28a and 28b are formed closer to each other and the trenches are formed deeper to achieve higher integration, a punch through phenomenon (a = 0) finally occurs in which the depletion regions 36a and 36b come in contact with each other. If the punch through phenomenon occurs, conduction occurs between the adjacent memory cells, so that the potentials stored in the n+impurity regions 30a and 30b interfere with each other by the difference in memory information of the adjacent memory cells. As a result, the characteristic of holding information is deteriorated.

Therefore, it becomes difficult to form the adjacent trenches 24a and 24b at a shorter distance and form the trenches deeper, which presents a large problem for high integration of the memory cells. To prevent this, some approaches have been proposed. For example, the impurity concentration of the semiconductor substrate 11 is increased. Alternatively, an epitaxial growth substrate is used as the semiconductor substrate 11. If the impurity concentration is increased, the expansion of the depletion regions can be surely controlled. However, the widths of the depletion regions are decreased, so that the junction breakdown voltage between the n+impurity regions and the semiconductor substrate is reduced. In addition, since the impurity concentration is further increased in the vicinity of the major surface of the semiconductor substrate 11, it becomes difficult to control the threshold voltage of the switching transistor. On the other hand, the approach of using the epitaxial growth substrate is effective. However, the substrate becomes expensive. In addition, since an epitaxial growth process is added, the manufacturing process is further complicated.

In addition, a method for manufacturing a dynamic RAM having a capacitor formed of polysilicon-polysilicon by utilizing a trench is disclosed in Japanese Patent Laying-Open Gazette No. 177771/1986 by Masahiro Hatanaka et al., entitled "Method for Manufacturing Semiconductor Device".

Furthermore, a semiconductor device in which a capacitor is further formed of polysilicon-polysilicon by utilizing a trench so that the amount of stored charges is increased disclosed in Japanese Patent Laying-Open Gazette No. 253255/1985 by Takayuki Matsukawa et al., entitled "Semiconductor Device".

However, both of the above described documents disclose a dynamic RAM having a structure for increasing the amount of stored charges by utilizing only a single trench but do not disclose an approach for solving the above described interference between adjacent trenches. Thus, the above described disclosures fail to solve the problems to be solved by the present invention or suggest solutions thereof.

SUMMARY OF THE INVENTION

An object of the present invention is to provide a DRAM having storage capacitors capable of high integration density.

Another object of the invention is to provide a DRAM having a modified trench-type capacitor structure that is capable of high integration density and sufficient capacitance to be relatively immune to soft errors.

Another object is to provide a DRAM having a novel storage capacitor structure, wherein no punch through between adjacent cells occurs.

A further object is to provide a DRAM having trench-type and stacked polysilicon data storage capacitors in adjacent cells of the array, to substantially double the integration density of the capacitors.

In order to attain the above described objects, a semiconductor memory device according to the present invention generally comprises an array of transistors formed on a semiconductor substrate of a first conductivity type, wherein each of the transistors consists of source and drain impurity regions of an opposite conductivity type formed in the substrate and a gate between and insulated from the source and drain impurity regions, a first trench-type capacitor coupled to a first one of the transistors, the first trench-type capacitor comprising a first impurity region on the sidewall of a trench formed in said substrate and a first conductive material in the trench separated from the first impurity region by an insulating layer, the first impurity region and the first conductive material forming plates of the trench-type capacitor, and a second, stacked capacitor coupled to a second one of the transistors adjacent the first transistor, the second, stacked capacitor comprising a second conductive material disposed vertically to and insulated from the first conductive material, the first and second conductive materials forming plates of the second, stacked capacitor.

Furthermore, in accordance with another aspect, the semiconductor memory device according to the present invention comprises a semiconductor substrate of a particular conductivity type and having a main surface, a trench extending from a given portion of the main surface into the substrate, an insulating film formed on the surface of the trench and on the major surface of the substrate, a first impurity region of an opposite conductivity type formed on at least the sidewall of the trench and beneath the film, a first conductive material formed in the trench on the insulating film, the first impurity region and the first conductive material with the insulating film formed therebetween constituting a first, trench-type capacitor for storing electric charge representing information associated with one of the cells, a second impurity region of the opposite conductivity type formed on the major surface on one side of the trench and spaced from the first impurity region, a third impurity region of the opposite conductivity type formed on the major surface of the substrate on an opposite side of the trench and spaced from the first impurity region, a fourth impurity region of the opposite conductivity type formed on the major surface of the substrate on the one side of the trench and spaced from the second impurity region, second conductive materials in the insulating film between the first and third impurity regions and between the second and fourth impurity regions, a third conductive material in the insulating film in contact with the second impurity region and extending vertically with respect to the first conductive material and insulated therefrom by the insulating film, the first and third conductive materials and the insulating film forming a second, stacked capacitor for storing electric charge representing information associated with a second one of the cells, the first and third impurity regions forming the source/drain regions and one of the second conductive materials forming the gate region of a first transistor associated with the trench-type capacitor, the second and fourth impurity regions forming the source/drain regions and the other one of the second conductive materials forming the gate region of a second transistor associated with the stacked capacitor.

In the semiconductor memory device having the above described structure, one of the adjacent memory cells comprises a trench-type capacitor and the other thereof comprises a stacked capacitor, so that a punch through phenomenon can be prevented between the adjacent memory cells and electrical interference therebetween can be prevented. In accordance with still another aspect, since the other stacked capacitor is formed over the one trench-type capacitor, the integration density of the capacitors is substantially doubled, which can largely contribute to improvement of the reliability and high integration of the semiconductor memory device.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
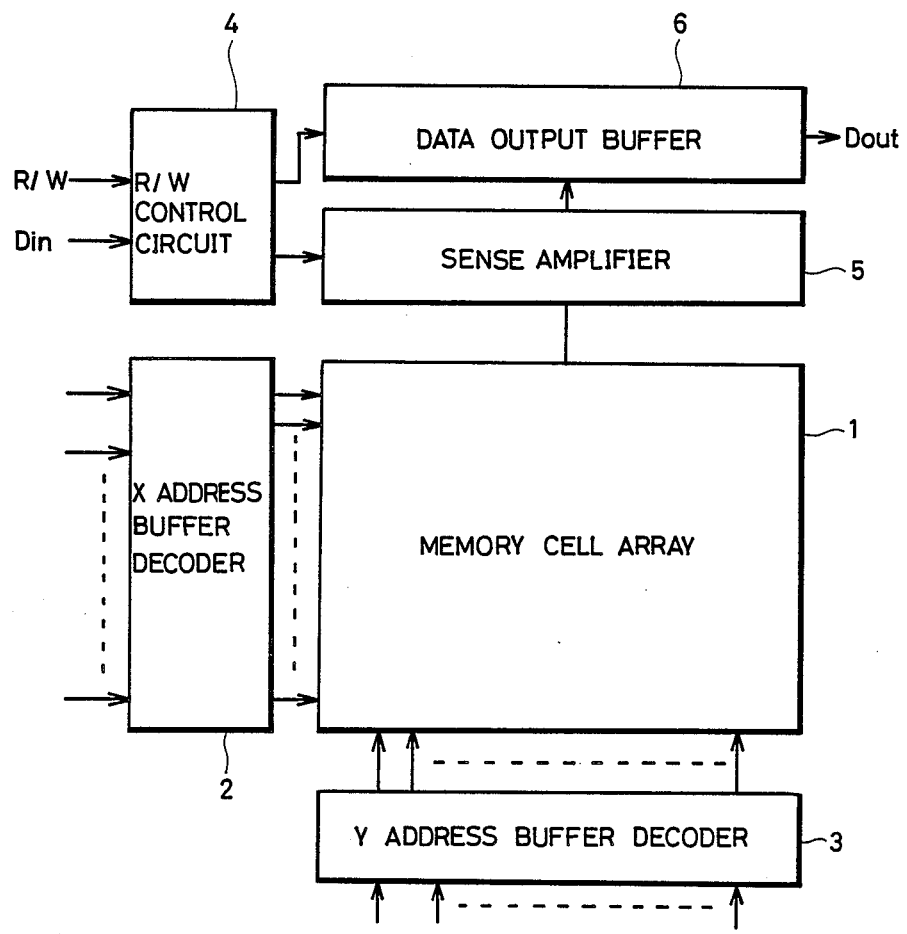
FIG. 1 is a block diagram showing an example of a structure of a conventional RAM, where components around a memory cell array are illustrated.
Figure 2:
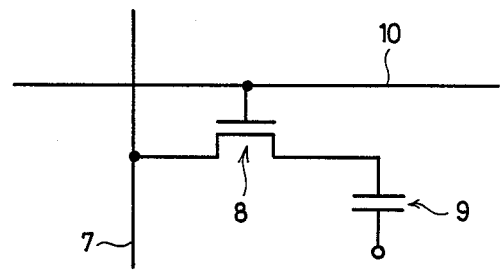
FIG. 2 is a diagram of an equivalent circuit of a dynamic type memory cell.
Figure 3:
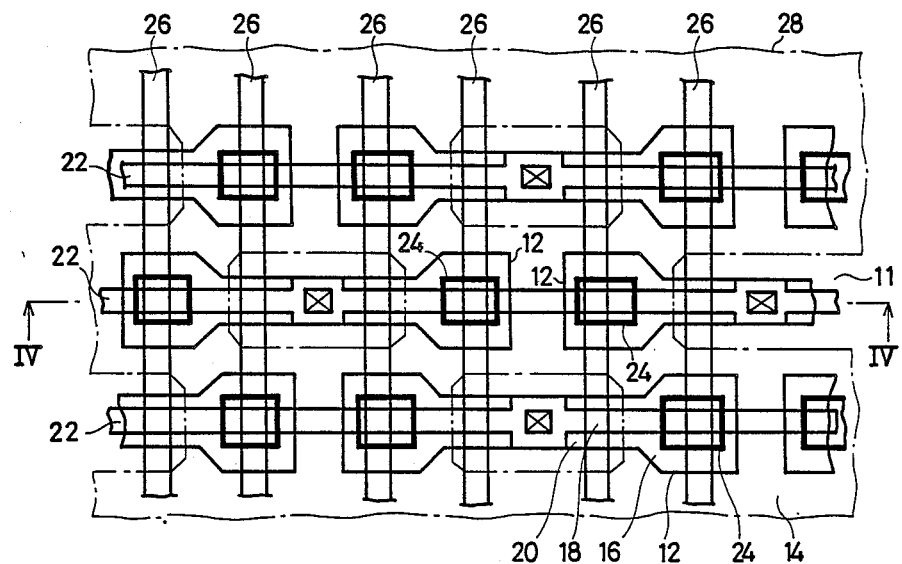
FIG. 3 is a plan view of a dynamic RAM of a folded bit line type, where the positional relation of adjacent memory cells each having a trench capacitor is illustrated.
Figure 4:
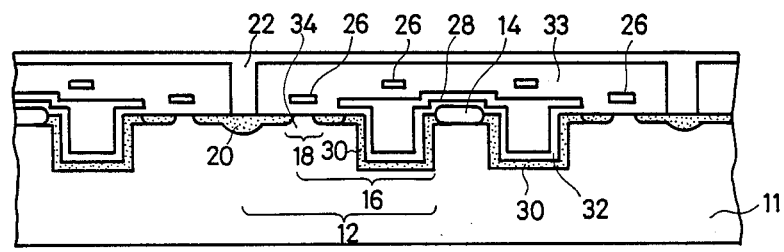
FIG. 4 is a cross sectional view taken along a line IV—IV shown in FIG. 3, where the relation between trench capacitors of the adjacent memory cells is illustrated.
Figure 5:
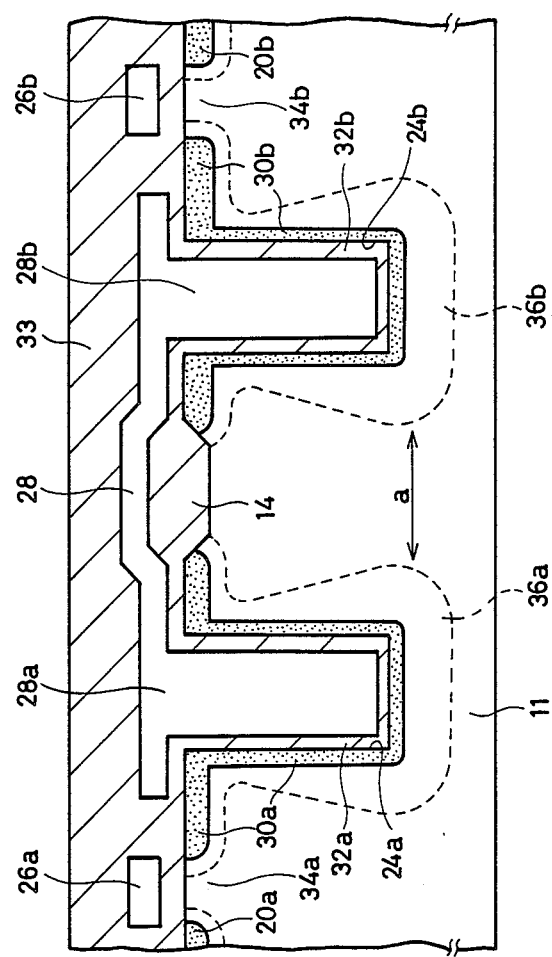
FIG. 5 is an enlarged cross sectional view of the adjacent memory cells shown in FIG. 4, where expansion of depletion regions around impurity regions formed on the inner surface of trenches is illustrated.
Figure 6:
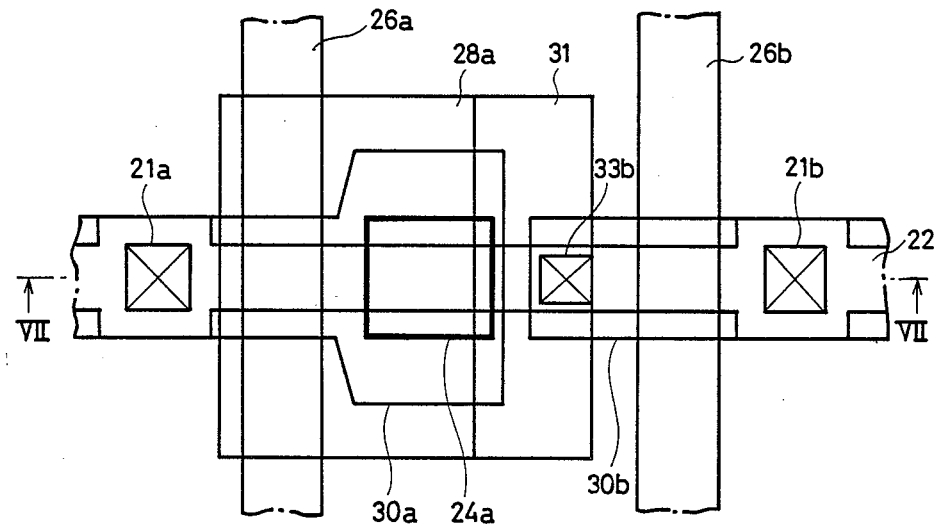
FIG. 6 is a plan view of adjacent memory cells according to the present invention, where only one of the memory cells includes a trench capacitor.
Figure 7:
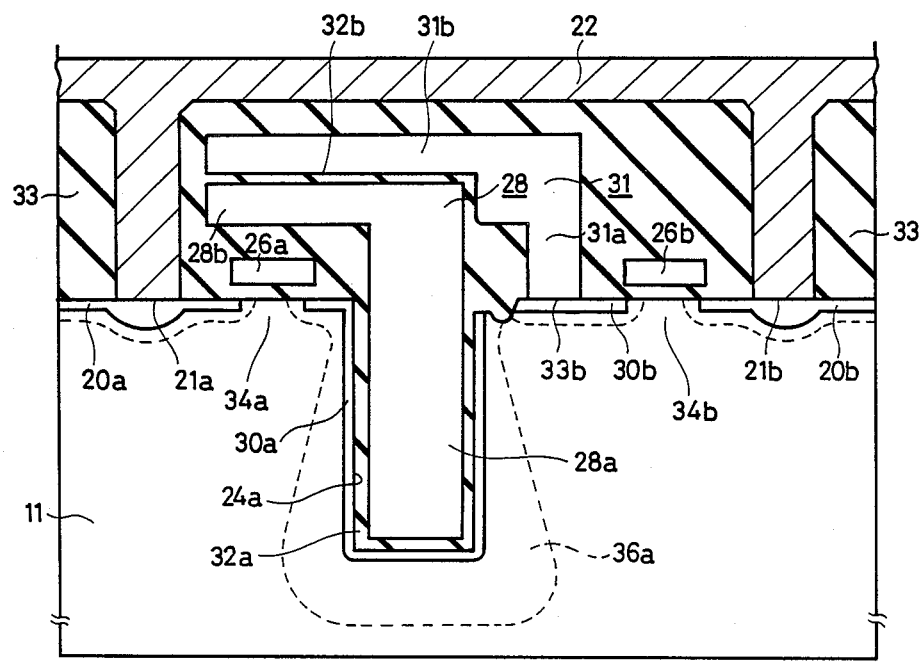
FIG. 7 is a cross sectional view taken along a line VII—VII shown in FIG. 6, where a capacitor of the other memory cell is stacked on the trench capacitor of one memory cell.

FIG. 6 is a plan view of adjacent memory cells according to an embodiment of the present invention, and FIG. 7 is a cross sectional view thereof.

Referring to FIGS. 6 and 7, description is made on a structure of the semiconductor device. An n type impurity region 30a is formed on the inner surface of a trench 24a formed on the major surface of a semiconductor substrate 11 comprising a P type silicon substrate and on a part of the major surface of the semiconductor substrate 11. The inner surface of the trench 24a is covered with a capacitor insulating film 32a. The trench 24a is filled with a cell plate 28 comprising polysilicon through the capacitor insulating film 32a. The cell plate 28 has a reversed L-shaped cross section, and comprises a vertical portion 28a in the trench 24a and a horizontal portion 28b parallel to the major surface of the semiconductor substrate 11. An n type impurity region 20a is formed on the major surface of the semiconductor substrate 11 spaced, by a predetermined distance, from the impurity region 30a formed on a part of the major surface of the semiconductor substrate 11. An electric conductor 26a comprising polysilicon or the like is formed over a region between the impurity regions 30a and 20a, on the major surface of the semiconductor substrate 11 through an insulating film 33, and under the horizontal portion 28b of the cell plate 28. On the other hand, an n type impurity region 30b is formed on the major surface of the semiconductor substrate 11 spaced, by a predetermined distance, from the trench 24a on the opposite side of the trench 24a. An n type impurity region 20b is formed on the major surface of the semiconductor substrate 11 spaced, by a predetermined distance, from the impurity region 30b in the opposite direction of the trench 24a. An electric conductor 26b comprising polysilicon or the like is formed over a region between the impurity regions 30b and 20b and on the major surface of the semiconductor substrate 11 through the insulating film 33. An electric conductor 31 comprising polysilicon or the like having a reversed L-shaped cross section is formed on the impurity region 30b. The electric conductor 31 has a vertical portion 31a connected to the impurity region 30b through a contact 33b and a horizontal portion 31b stacked on the horizontal portion 28b of the cell plate 28 through an insulating film 32b. The insulating film 33 is formed to cover all of the above described components. An interconnection layer 22 comprising aluminum or the like patterned in a predetermined shape is formed on the insulating film 33. The interconnection 22 is connected to the impurity regions 20a and 20b through contacts 21a and 21b, respectively.

A charge storage region of a first memory cell comprises a part of the horizontal portion 28a of the cell plate 28, the capacitor insulating film 32a and the impurity region 30a, and a transfer gate region thereof comprises a channel region 34a between the impurity regions 30a and 20a and the electric conductor 26a connected to a word line and serving as a gate electrode. The impurity region 20a serving as a source or drain region is connected to the interconnection 22 serving as a bit line through a contact for external connection. A charge storage region of a second memory cell comprises the horizontal portion 31b of the electric conductor 31, the insulating film 32b and the horizontal portion 28b of the cell plate 28, and a transfer gate region thereof comprises a channel region 34b between the impurity regions 20b and 30b and the electric conductor 26b connected to a word line and serving as a gate electrode. The impurity region 20b serving as a source or drain region is connected to the interconnection 22 serving as a bit line through a contact for external connection. When the electric conductor 31 is connected to the impurity region 30b serving as a source or drain region through the contact 33b, the transfer gate region and the charge storage region can be coupled to each other.

It would be obvious from the description of the above described structure that the charge storage region of the second memory cell, that is, a stacked capacitor is formed over the charge storage region of the first memory cell, that is, a trench-type capacitor. Thus, expansion of a depletion region 36a of the impurity region 30a of the first memory cell, which occurs during operation, does not affect the charge storage region of the second memory cell. In addition, when the areas occupied by the charge storage regions of the first and second memory cells are observed in a two-dimensional manner, they will be found advantageous, as compared with the conventional occupied areas. More specifically, the substantial density of the capacitors of the first and second memory cells is almost doubled by the stacked capacitor of the second memory cell. Although in the present embodiment, capacitance of the trench-type capacitor and the stacked capacitor is not particularly defined, it is desirable that the capacitors have the same capacitance in terms of operating characteristics.

Description is now made on a method for manufacturing the semiconductor memory device according to the present invention. FIGS. 8A to 8E illustrate cross sections in the main steps of manufacturing processes according to an embodiment in the method for manufacturing the semiconductor memory device.

Figure 8A:
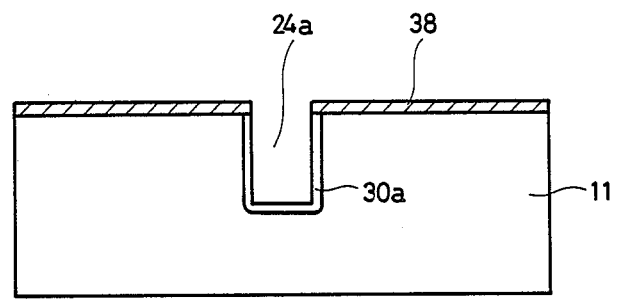
FIGS. 8A to 8E are diagrams showing processes according to an embodiment in a method for manufacturing a semiconductor memory device according to the present invention, where a cross section in the main steps of the manufacturing processes are illustrated.

Referring to FIG. 8A, a resist 38 patterned in a predetermined shape is formed on the major surface of the semiconductor substrate 11 comprising a P type silicon substrate and the exposed semiconductor substrate 11 is etched utilizing the resist 38 as a mask, so that a trench 24a having a predetermined depth is formed. N type impurities are ion-implanted into the inner surface of the trench 24a, so that an n type impurity region 30a is formed.

Figure 8B:
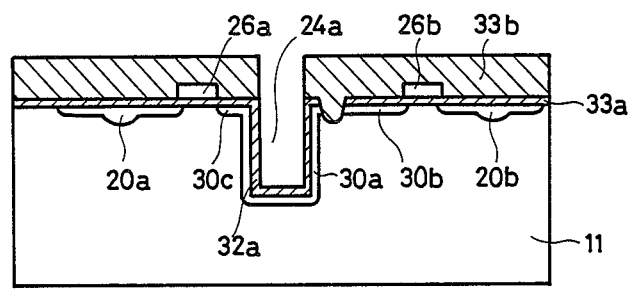

After the resist 38 is removed, a new resist patterned in a predetermined shape is formed on the major surface of the semiconductor substrate 11 and n type impurities are ion-implanted utilizing the resist as a mask, so that impurity regions 20a, 30b, 30c and 20b are formed. Referring now to FIG. 8B, a thin oxide film comprising a gate insulating film 33a and a capacitor insulating film 32a is formed on the entire major surface of the semiconductor substrate 11 including the inner surface of the trench 24a. Polysilicon is deposited on the gate insulating film 33a and patterned into a predetermined shape, so that gate electrodes 26a and 26b are formed. In addition, an oxide film 33b is formed on the entire surface of the gate insulating film 33a to cover the gate electrodes 26a and 26b. At that time, in order to isolate the impurity region 30a from the impurity region 30b, an oxide film is formed on a part of the major surface of the semiconductor substrate 11.

Figure 8C:
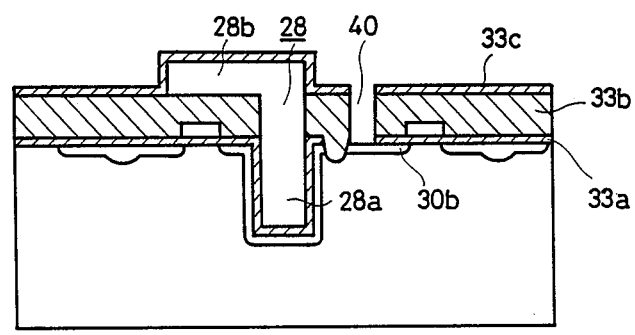

Subsequently, polysilicon is deposited on the entire surface of the oxide film 33b including the inner surface of the trench 24a and patterned, so that a cell plate 28 comprising a vertical portion 28a in which the trench 24a is filled and a horizontal portion 28b formed on a part of the insulating film 33b are formed. An oxide film 33c is formed on the entire surface of the oxide film 33b to cover the horizontal portion 28b of the cell plate 28. As shown in FIG. 8C, a contact hole 40 which attains the impurity region 30b is formed in the oxide films 33a, 33b and 33c.

Figure 8D:
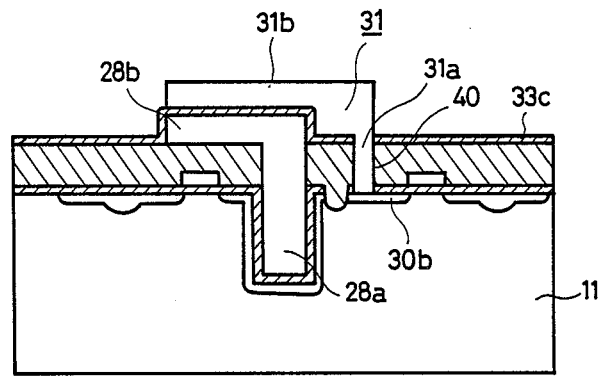

Polysilicon is deposited to cover the entire surface of oxide film 33c including the inside of the contact hole 40 and patterned, so that an electric conductor 31 comprising a vertical portion 31a in which the contact hole 40 is filled and a horizontal portion 31b stacked on the upper portion of the horizontal portion 28b of the cell plate 28 through the oxide film 33c, as shown in FIG. 8D.

Figure 8E:
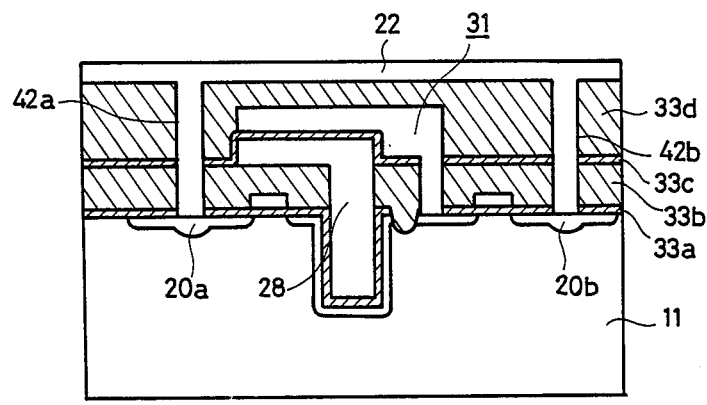

Furthermore, an oxide film 33d serving as an interlayer dielectric film is formed on the entire surface of the oxide film 33c to cover the electric conductor 31, and contact holes 42a and 42b which attain the impurity regions 20a and 20b are formed in the oxide films 33a to 33d. An interconnection material such as aluminum is deposited on the entire surface of the oxide film 33d including the contact holes 42a and 42b and patterned, so that an interconnection 22 which is connected to the impurity regions 20a and 20b through the contact hole 42a and 42b is formed as shown in FIG. 8E.

The semiconductor memory device according to the present invention as shown in FIG. 7 is manufactured through the above described manufacturing processes. Thereafter, they are followed by processes of, for example, forming a protective film on the interconnection 22. The processes are known and are not characteristics of the present invention and therefore, the description thereof is omitted.

Although in the above described embodiment, conductivity types of a semiconductor substrate and an impurity region are specified, all of conductivity types may be reversed, in which case the present invention can be applied.

Additionally, although in the present embodiment showing the above described manufacturing processes, the impurity region is formed by ion implantation, it may be formed by diffusion.

Although the present invention has been described and illustrate in detail, it is clearly understood that the same is by way of illustration and example only and is not to be taken by way of limitation, the spirit and scope of the present invention being limited only by the terms of the appended claims.

What is claimed is:

1. In a semiconductor memory comprising an array of transistors formed on a semiconductor substrate of a first conductivity type, wherein each of said transistors has source and drain impurity regions of an opposite conductivity type formed in said substrate and a gate between and insulated from said source and drain impurity regions:

a first, trench-type capacitor coupled to a first one of said transistors, said first trench-type capacitor comprising a first impurity region on the sidewall of a trench formed in said substrate and a first conductive material in said trench separated from said first impurity region by an insulating layer, said first impurity region and said first conductive material forming plates of said trench-type capacitor; and a second, stacked capacitor coupled to a second one of said transistors adjacent said first transistor, said second, stacked capacitor comprising a second conductive material insulated from said first conductive material and disposed vertically to and entirely outside said trench, said first and second conductive materials forming plates of said second, stacked capacitor.

2. A semiconductor memory according to claim 1, wherein said first impurity region is also formed on the bottom surface of said trench.

3. A semiconductor memory according to claim 1, wherein said first conductive material has a first horizontal portion and said second conductive material has a second horizontal portion.

4. A semiconductor memory according to claim 3, wherein said second horizontal portion is formed on said first horizontal portion through an insulating film, said first horizontal portion, said second horizontal portion and said insulating film constituting said second, stacked capacitor.

5. A semiconductor random access memory device formed of an array of memory cells, comprising:
a semiconductor substrate of a particular conductivity type and having a main surface, a trench extending from a given portion of the main surface into the substrate;
an insulating film formed on the surface of said trench and on the major surface of said substrate;
a first impurity region of an opposite conductivity type formed on at least the sidewall of said trench and beneath said film;
a first conductive material formed in said trench on said insulating film;
said first impurity region and said first conductive material with said insulating film formed therebetween constituting a first, trench-type capacitor for storing electric charge representing information associated with one of said cells;
a second impurity region of said opposite conductivity type formed on the major surface on one side of said trench and spaced from said first impurity region;
a third impurity region of said opposite conductivity type formed on the major surface of said substrate on an opposite side of said trench and spaced from said first impurity region;
a fourth impurity region of said opposite conductivity type formed on the major surface of said substrate on said one side of said trench and spaced from said second impurity region;
second conductivity materials in said insulating film between said first and third impurity regions and between said second and fourth impurity regions;
a third conductive material in said insulating film in contact with said second impurity region and extending vertically with respect to said first conductive material and insulated therefrom by said insulating film;
said first and third conductive materials and said insulating film forming a second, stacked capacitor for storing electric charge representing information associated with a second one of said cells, said third conductive material being disposed above, and entirely outside, said trench;
said first and third impurity regions forming the source/drain regions and one of the second conductive materials forming the gate region of a first transistor associated with said trench-type capacitor; and
said second and fourth impurity regions forming the source/drain regions and the other one of the second conductive materials forming the gate region of a second transistor associated with said stacked capacitor.

6. A semiconductor random access memory device according to claim 5, wherein said first conductive material comprises a first vertical portion and a first horizontal portion, said trench being filled with the material of said first vertical portion.

7. A semiconductor random access memory device according to claim 6, wherein said third conductive material comprises a second vertical portion and a second horizontal portion, said second vertical portion being connected to said second impurity region.

8. A semiconductor random access memory device according to claim 7, wherein said second horizontal portion is formed on said first horizontal portion with said insulating film formed therebetween, said first horizontal portion, said second horizontal portion and said insulating film constituting said trench-type capacitor.

9. A semiconductor random access memory device according to claim 8, wherein said first and second horizontal portions are located over said one of said second conductive materials.

10. A semiconductor random access memory device according to claim 5, wherein said trench-type capacitor and said stacked capacitor have the same charge storage capacitance.

11. A semiconductor random access memory device according to claim 5, wherein said first and third conductive materials comprise polysilicon.

12. A semiconductor random access memory device according to claim 5, wherein said semiconductor substrate comprises a silicon substrate.

13. In a semiconductor memory comprising an array of transistors formed on a semiconductor substrate of a first conductivity type, wherein each of said transistors has source and drain impurity regions of an opposite conductivity type formed in said substrate and a gate between and insulated from said source and drain impurity regions:
a first, trench-type capacitor coupled to a first one of said transistors, said first trench-type capacitor comprising a first impurity region on the sidewall of a trench formed in said substrate and a first conductive material in said trench separated from said first impurity region by an insulating layer, said first impurity region and said first conductive material forming plates of said trench-type capacitor; and
a second, stacked capacitor coupled to a second one of said transistors adjacent said first transistor, said second, stacked capacitor comprising a second conductive material disposed entirely outside said trench vertically to and insulated from said first conductive material, said first and second conductive materials forming plates of said second, stacked capacitor;
wherein said first and second conductive materials have horizontal portions that extend above the gate of one of said transistors.

* * * * *